United States Patent [19]
Tran et al.

[11] Patent Number: 5,796,128
[45] Date of Patent: Aug. 18, 1998

[54] GATE ARRAY WITH FULLY WIRED MULTIPLEXER CIRCUITS

[75] Inventors: Dzung Joseph Tran; Mark Warren Acuff, both of Hillsboro, Oreg.

[73] Assignee: TransLogic Technology, Inc., Beaverton, Oreg.

[21] Appl. No.: 695,068

[22] Filed: Jul. 25, 1996

[51] Int. Cl.$^6$ .................................................. H01L 27/105
[52] U.S. Cl. ......................... 257/202; 257/204; 257/206; 326/41; 326/50; 326/114
[58] Field of Search ........................... 257/202, 204, 257/206, 207; 326/41, 47, 50, 114, 121

[56] References Cited

U.S. PATENT DOCUMENTS

| | | | |
|---|---|---|---|
| 4,616,358 | 10/1986 | Rehm et al. | 370/58 |
| 5,055,716 | 10/1991 | El Gamel | 307/446 |
| 5,162,666 | 11/1992 | Tran | 307/243 |
| 5,164,811 | 11/1992 | Tamura | 257/206 |
| 5,187,556 | 2/1993 | Nariishi et al. | 257/206 |
| 5,289,021 | 2/1994 | El Gamel | 257/296 |
| 5,391,943 | 2/1995 | Mahant-Shetti et al. | 257/203 |
| 5,422,581 | 6/1995 | Mahant-Shetti et al. | 257/206 |
| 5,581,202 | 12/1996 | Yano et al. | 257/206 |

*Primary Examiner*—David B. Hardy
*Attorney, Agent, or Firm*—Klarquist Sparkman Campbell Leigh & Whinston, LLP

[57] ABSTRACT

A gate array architecture adapted for serial multiplexer-based circuits. In one embodiment, the gate array contains base cells having functional but isolated serial multiplexer circuits therein. In another embodiment, a base cell contains a single serial multiplexer circuit divisible into varying-sized (size corresponding to the number of inputs) derivative serial multiplexer circuits. In either embodiment, the serial multiplexer circuits within the base cell may be formed from P- and N-channel transistors of varying size. The transistor sizes are chosen to optimize the efficiency of serial multiplexer-based circuits.

21 Claims, 4 Drawing Sheets

GATE ARRAY WITH FULLY WIRED MULTIPLEXER CIRCUITS

FIELD OF THE INVENTION

This invention relates generally to integrated circuits, and, more particularly, relates to a gate array architecture used to produce integrated circuits.

BACKGROUND OF THE INVENTION

Gate arrays are frequently used to create Application Specific Integrated Circuits (ASIC) in a short period of time. Gate-arrays are typically stocked by a vendor in the form of master or base wafers containing a silicon die of unconnected transistors. A circuit designer provides a design-specific circuit to a vendor in the form of a netlist, which calls out each desired transistor-to-transistor interconnect in the circuit. The vendor then interconnects the transistors as specified by the netlist using metal masks. The masks interconnect transistors to form base components, such as an AND, OR or NOR gate, and interconnect the base components together to form the design-specific circuit. Wiring between rows of transistors may occur over the top of unused transistors, as in a "sea-of-gates" type gate array, or may be constrained to routing channels between transistors, as in more conventional gate arrays. The resulting integrated circuit is semi-custom in that a designer has no control over the size or layout of the unconnected transistors in the master wafer, but can control the interconnection between transistors to create a custom function.

Gate arrays minimize the cost of integrated circuits because a high volume of identical master wafers may be manufactured and used for many different designs. Additionally, only two to five metal masks need to be generated to create a design-specific circuit, which also minimizes cost and allows vendors to provide quick turnaround from delivery of a netlist to completion of an ASIC.

Most gate array architectures use equal-sized transistors for ease of fabrication and to make the architecture adaptable to a wide variety of circuit designs. The absolute size of transistors is a trade-off between drive capability, loading and the array density required. Some architectures, however, use varying-size transistors to increase efficiency for specific circuit designs, such as the architectures disclosed in U.S. Pat. Nos. 5,289,021 and 5,055,716, both to El Gamel.

There are, however, some disadvantages to gate array architectures. For example, these architectures have a utilization factor (the number of gates that may be used divided by the total number of gates) of only 40 to 50 percent. Additionally, these architectures tend to have long interconnect lines within and between components which increases the parasitic capacitance and, consequently, increases the propagation delay of the circuit. Transistor sizes are also dictated by the master wafer, rather than using the optimal size for a given component. These disadvantages underscore the need for more efficient gate array architectures.

Vendors can also provide a full-custom ASIC where transistor sizes, placement and interconnects are controlled by the designer. These architectures typically require between ten and fifteen metal masks to produce a design-specific circuit. The large number of masks increases expense and slows the turnaround time from delivery of a netlist to completion of an ASIC.

Both semi- and full-custom gate array architectures have worked well for implementing circuits containing standard components, such as AND, OR, or NOR gates, but they are not readily adaptable to recently developed circuit components, such as the serial multiplexers disclosed in U.S. Pat. No. 5,162,666 to Tran. Gate array architectures containing serial multiplexer-based circuits leave many gates unutilized, have many transistors that are either too big or too small to be used efficiently by the serial multiplexers, and require long metal interconnect lines that produce high capacitance and, consequently, longer propagation delays.

An objective of the invention is, therefore, to provide a gate array architecture that allows serial multiplexer-based ASICs to be implemented efficiently. A further objective is to provide such an architecture that simplifies fabrication and, consequently, reduces costs and allows for quick netlist-to-ASIC turnaround.

SUMMARY OF THE INVENTION

The present invention provides a master wafer, gate array architecture adapted for serial multiplexer-based circuits that has the cost advantages of semi-custom architectures, with near the circuit optimization of full-custom architectures. Using this architecture, only component-to-component connection is needed to fabricate a design-specific circuit, thereby simplifying the fabrication process and increasing production yield.

In one embodiment of the present invention, the master wafer, gate array architecture contains base cells having first and second sections that are electrically or physically isolated from each other. The first and second sections contain functional first and second serial multiplexer circuits, respectively. The serial multiplexer circuits are base components that are couplable together to form the design-specific circuit.

In a second embodiment, a base cell may have an integral, serial multiplexer circuit that is divisible into separate serial multiplexer circuits. The separate serial multiplexer circuits may be derivative serial multiplexers of varying sizes (size corresponding to the number of inputs). Additional integral, but divisible serial multiplexer circuits may be added to the base cell.

In either embodiment, the serial multiplexer circuits within the base cell may be formed from P- and N-channel transistors of varying size. The transistor sizes are chosen to optimize the efficiency of serial multiplexer circuits.

The gate array architecture, according to the invention, uses minimal area and maximizes speed because the varying-size transistors allow short lead lines within each serial multiplexer circuit. Additionally, because the base cell includes functional, but isolated, serial multiplexer circuits, a metal mask only needs to interconnect the serial multiplexer circuits together to form the semi-custom design.

These advantages and other advantages and features of the inventions will become apparent from the following description of a preferred embodiment, which proceeds with reference to the following drawings.

DETAILED DESCRIPTION OF PREFERRED EMBODIMENTS

Figure 1:
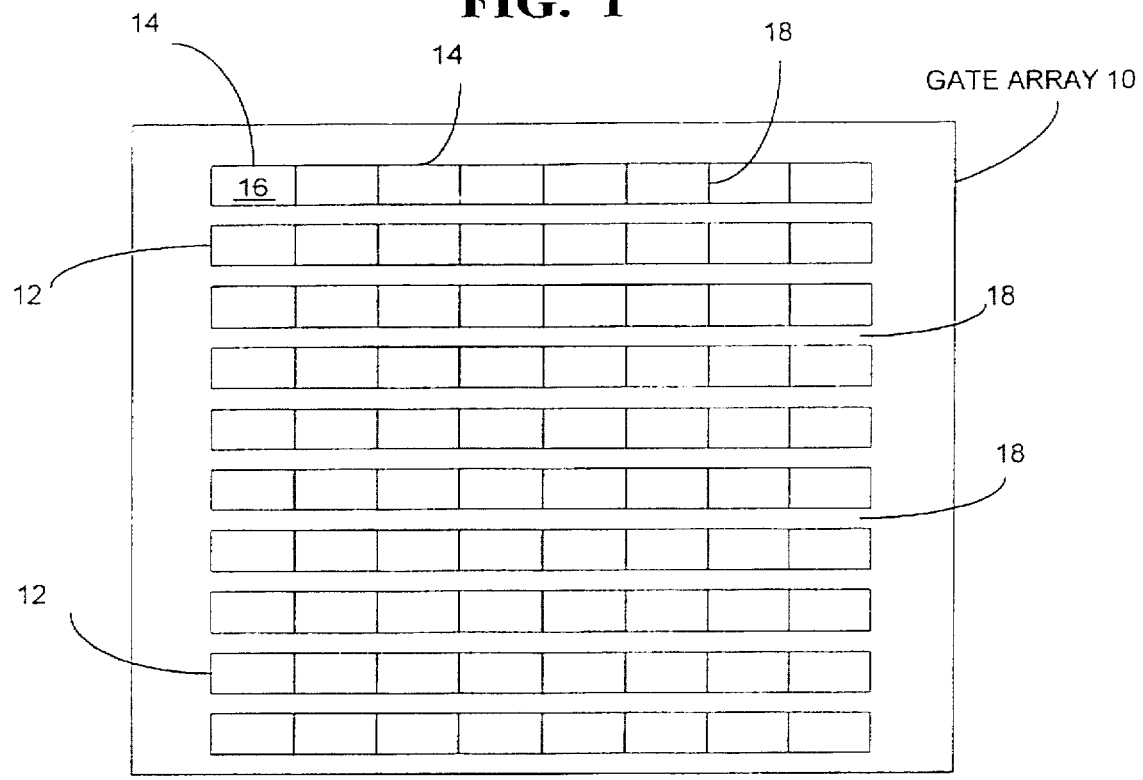
FIG. 1 is a diagram of a gate array architecture used in a master wafer formed from an array of base cells according to the invention.

Referring to FIG. 1, a gate array architecture 10 used in a master wafer according to the invention includes rows 12 and columns 14 of base cells 16 forming an array of base cells. The base cells 16 include serial multiplexer circuits (not shown) physically or electrically isolated from one another, as will be further described. The serial multiplexer circuits are formed from at least one transmission gate multiplexer (TGM) circuit such as the type described in U.S. Pat. No. 5,162,666, which is hereby incorporated by reference, but any number of TGM circuits can be combined in series or parallel. The base cells may also include other standard circuit components in addition to serial multiplexer circuits, such as AND, OR, NOR, or NAND gates. The serial multiplexers are design-independent, meaning that they are formed from a standard and predetermined interconnection of transistors over which a designer has no control. It is the vendor that controls the interconnection of transistors to form the predetermined serial multiplexer circuits. Vendors create a high volume of these master wafers having design-independent serial multiplexers thereon at low cost. The master wafer is personalized by using design-specific metalization to interconnect the separate serial multiplexer circuits within a base cell or between base cells to form a semi-custom circuit. Sufficient spacing 18 between the rows 12 and columns 14 of cells 16 allows metal interconnects to be routed between the base cells. The base cells 16 of the gate array 10 may take many different forms. For example, all the base cells within the gate array may be substantially equivalent to one another. Alternatively, the base cells within a single row may be substantially equivalent, while other rows of base cells contain different design-independent circuits or components. A further alternative could have each individual base cell in the array having different design-independent circuits or components from other base cells.

Figure 2:
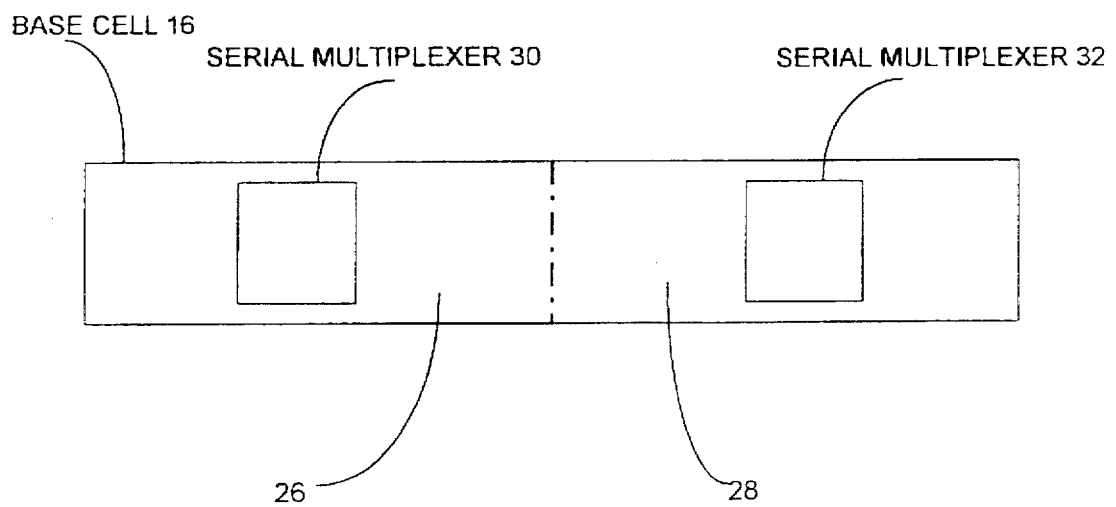
FIG. 2 is an enlarged diagram of a base cell of FIG. 1 having several serial multiplexer circuits.

FIG. 2 shows an example of a base cell 16 containing two sections 26 and 28, each containing one serial multiplexer circuit 30, 32, respectively. The serial multiplexer circuits may be virtually any size, i.e., they may have any number of inputs. For example, circuit 30 may be a two-input serial multiplexer (M2), while circuit 32 may have three inputs (M3). The serial multiplexer circuits 30, 32 are either physically isolated from one another or electrically isolated by a circuit element such as a transistor in the off state. The sections 26 and 28 are, consequently, also isolated from each other. The serial multiplexers are functional, meaning they are formed from a plurality of connected transistors so that the serial multiplexers are capable of operating and carrying out their designed function. Prior gate array architectures for a master wafer typically had unconnected transistors that must be connected by a designer to create functional circuit components. By having a master wafer with functional serial multiplexers thereon, fewer metal interconnects are needed to customize a design-specific circuit. The resultant design-specific circuits are faster because less parasitic capacitance is being driven. Additionally, the serial multiplexers take less chip area, which allows for increased functionality and a higher production yield.

Figure 3:
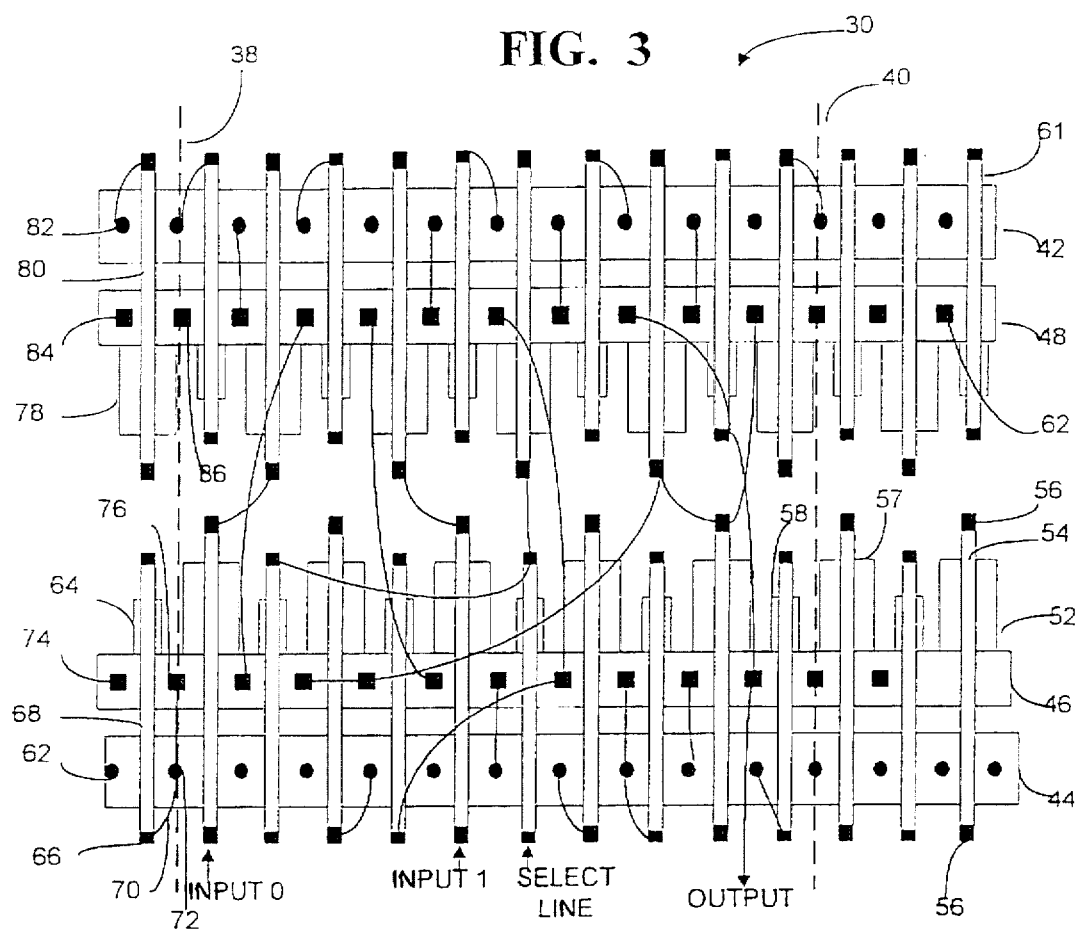
FIG. 3 is a detailed diagram showing a transistor configuration and interconnection that can be used to form a serial multiplexer circuit of FIG. 2.

FIG. 3 shows an exemplary transistor configuration of a two-input serial multiplexer circuit 30 that may be implemented within a base cell 16. Dashed lines 38 and 40 represent the left and right boundaries, respectively, of the circuit 30. To the left of dashed line 38 and to the right of dashed line 40 may be other circuit components such as additional serial multiplexer circuits within the same base cell as circuit 30 or within other base cells in a row 12. A power rail 42 and a ground rail 44 run parallel to each other and define the top and bottom, respectively, of the circuit 30. An N-type diffusion strip 46 is positioned parallel to and adjacent to ground rail 44. A P-type diffusion strip 48 runs parallel to and adjacent to the power rail 42. The power and ground rails 42, 44 and the diffusion strips 46, 48 may extend for any desired length, such as the length of an entire row 12 (see FIG. 1), or may extend for only a base cell 16.

The N-type diffusion strip 46 has N+ dopant diffused in a P-type well (not shown). The size (width) of the N+ diffusions are shown for illustrative purposes only as boxes 52 attached to the N-type diffusion strip 46. Gates 54, made of polysilicon or similar material, cross the N+ diffusions to form a continuous row of N-channel transistors along strip 46, one transistor per gate. The gates are shown with pads 56 on opposite ends of the gates for the connection of metal interconnects. The N+ diffusion dictates the size or width of each transistor as illustrated by the size of the boxes 52. For example, box 57 is a transistor having a width of 6μ, while a smaller box 58 is a 4μ transistor. The 6μ and 4μ transistors alternate for the length of the N-type diffusion strip. These sizes of transistors are chosen for illustrative purposes, and other sizes may be used.

The P-diffusion strip 48 has a plurality of N-type wells with P+ dopant diffused therein (not shown). Gates 61 cross the P+ diffusions to form a row of P-channel transistors, one transistor per gate. The P-channel transistors alternate in size between 8μ and 2μ. The 2μ P-channel transistors are positioned opposite the 6μ N-channel transistors, and the 8μ P-channel transistors are positioned opposite the 4μ N-channel transistors. Thus, the circuit includes a row of alternating sized N-channel transistors parallel and adjacent to a row of alternating P-channel transistors, wherein the size of the transistors used is for optimal performance for serial multiplexers. The transistor sizes shown are only an example of possible transistor widths, and a wide variety of widths may be used. The transistors may also be all one size, if desired.

Connectors 62 are shown on the power and ground rails 42, 44 as darkened circles and on the N- and P-type diffusion strips 46, 48 as darkened squares. The connectors, which may be of any suitable type such as pads or vias, allow for the attachment of metal interconnects to the strips. The connectors 62 are located on either side of each transistor and represent input and output terminals for the transistor. In operation, a low-level logic signal applied to the gate of an N-channel transistor turns the transistor off, and conversely, a high-level logic signal applied to the same gate turns the transistor on. For example, in the case of the 4μ transistor 64 at the lower left of FIG. 3, a pad 66 on a gate 68 has an interconnect 70 attached thereto that is tied to a via 72 on the ground rail 44. Thus, the gate remains in the off state so that no current can flow between a pad 74 and a pad 76.

Along P-type diffusion strip 48 a high-level logic signal applied to the gate of a P-channel transistor turns the transistor off, while a low-level logic signal turns the transistor on. For example, an 8µ transistor 78 has its gate 80 tied to a via 82 on the power rail 42. Thus, the transistor is off and will not allow current to flow between pads 84 and 86. Conversely, if transistor 78 is tied to a logic low level, current flows between pads 84, 86. Transistors 64, 78 are isolation transistors (they will remain turned off) to electrically isolate multiplexer circuit 30 from other multiplexer circuits that may be adjacent to circuit 30 in the row. Electric isolation is accomplished by turning the transistors to an "off" state, effectively creating an open circuit.

Figure 6:
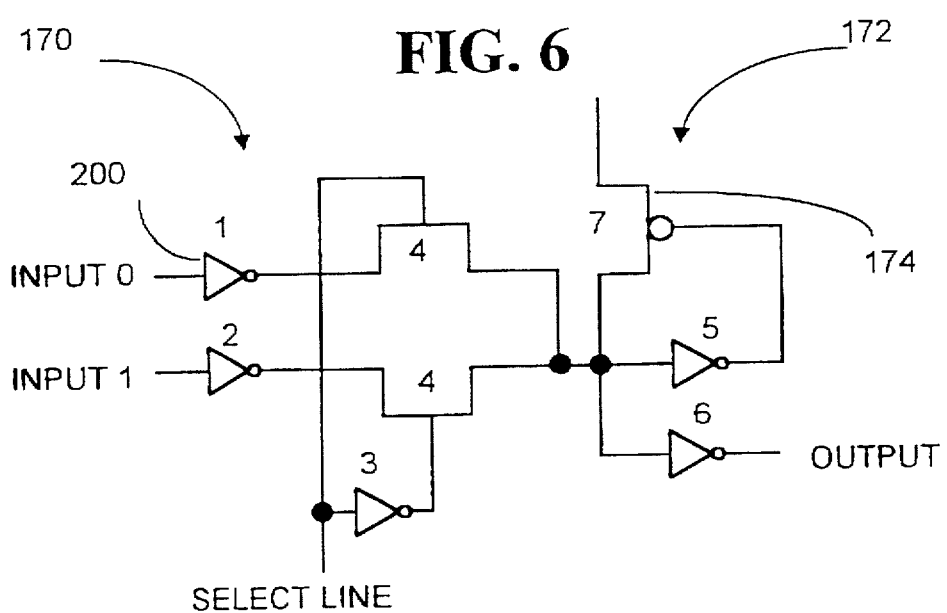
FIG. 6 is a diagram of a two-input serial multiplexer circuit with number designations on separate elements within the circuit.

The two-input multiplexer circuit 30 is shown having two inputs, Input 0 and Input 1, a select line and an output. The state of the select line dictates which signal on either Input 0 or 1 will pass to the output. A diagram of a similar serial multiplexer is shown in FIG. 6. One skilled in the art will readily appreciate how the transistor-to-transistor interconnect shown in FIG. 3 forms a two-input serial multiplexer circuit.

The circuit of FIG. 3 is a functional but isolated serial multiplexer base circuit that is illustrative of a serial multiplexer circuit having predetermined connections between transistors. These connections are design-independent, as they are provided on a master wafer stocked by a vendor. A designer may dictate the serial-multiplexer-to-serial-multiplexer connections to create a design-specific circuit.

Although the circuit of FIG. 3 allows for varying-sized transistors specifically designed for serial multiplexers, there is still room for increased efficiency because isolation transistors occupy valuable chip area.

Figure 4:
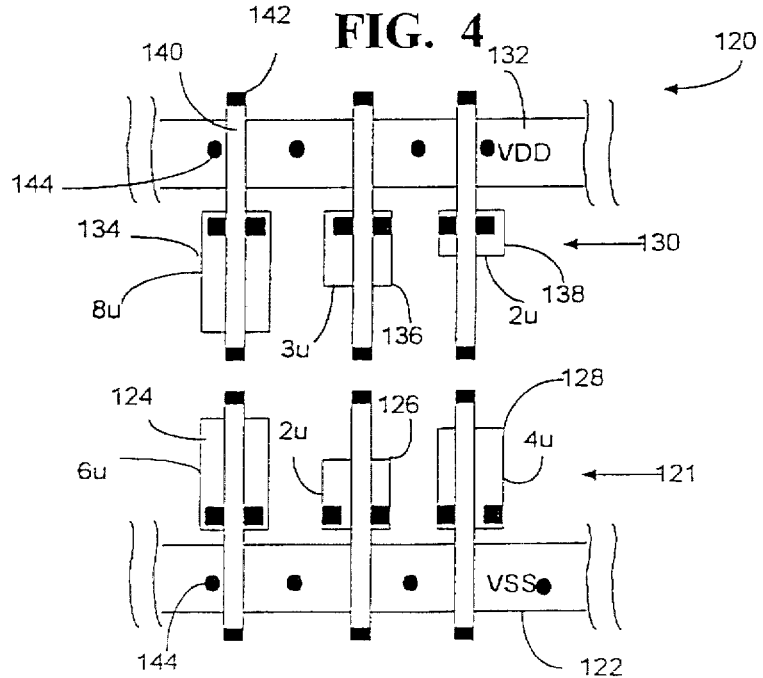
FIG. 4 is a diagram of a another transistor configuration that can be used to form a serial multiplexer circuit of FIG. 2.

FIG. 4 shows another transistor configuration according to the invention in which isolation transistors are not needed. In this configuration, a fragment of a multiplexer circuit 120 is shown (without interconnects) as a row of physically isolated N-channel transistors 121 and P-channel transistors 130. The physical isolation is accomplished by leaving spaces between the transistors rather than having a continuous diffusion as in FIG. 3. This spacing eliminates the need for isolation transistors. The N-channel transistors 121 are adjacent to the ground rail 122 and include three alternating sizes of transistors: a 6µ transistor 124, a 2µ transistor 126, and a 4µ transistor 128. As in FIG. 3, the size of the boxes corresponds to the width of the N+ diffusion. The row of P-type transistors 130 are adjacent to the power rail 132 and also includes three alternating sizes of transistors: an 8µ transistor 134, a 3µ transistor 136, and a 2µ transistor 138. The size of the transistors may be varied depending upon the design; the illustrated sizes are only examples.

All of the transistors in FIG. 4 have gates 140 crossing the N- and P-channel transistors and pads 142 on the gates for connection of metal interconnects. Vias 144 along the power rail 132 and ground rail 122 allow the connection of metal interconnects (not shown). In this case, the transistor configuration may be used to make one-half of a two-input serial multiplexer circuit. Typically, the 8/6 pair of transistors forms an input inverter, the 3/2 pair of transistors forms a select inverter or interstage inverter, the 4µ transistor is part of the pass gate string, and the 2µ transistor, if needed, is used as a pull-up.

The transistor configuration shown in FIG. 4 should be duplicated to implement a two-input serial multiplexer circuit. In such a circuit, only one of the 2µ transistors used as a pull-up transistor is normally needed. Thus, the transistor configuration of a two-input serial multiplexer can still be more efficiently designed.

Figure 5:
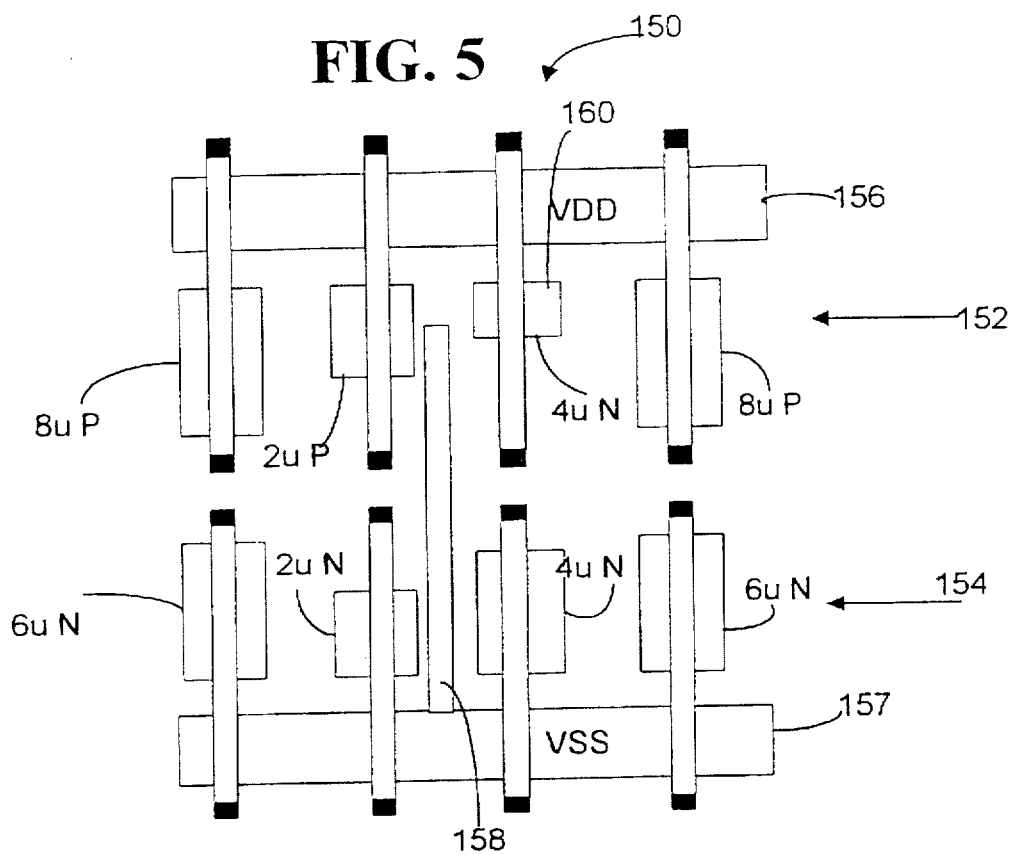
FIG. 5 is a diagram of yet another transistor configuration used to implement a serial multiplexer circuit of FIG. 2.

FIG. 5 shows yet another embodiment of a transistor configuration 150 according to the invention. As in FIG. 4, the transistor configuration has two rows 152 and 154 of transistors. In this embodiment, however, an N-channel transistor 160 is placed in row 152 adjacent to a power rail 156 in order to optimize the use of the chip area. Thus, row 152 adjacent to the power rail includes alternating sizes of N- and P-channel transistors. A metal run 158 brings a ground rail 157 voltage level to a well of the N-channel transistor 160. This transistor configuration is more suitable to serial multiplexer circuits because they use more N-channel transistors than P-channel. If desired, P-channel transistors may also be placed adjacent to ground rail 157. To accomplish this, a metal run should be positioned to bring a power rail voltage level to the P-channel transistor. Although only one N-channel transistor is shown near the power rail 156, multiple N-channel transistors may be positioned along the power rail. Likewise, multiple P-channel transistors may be placed along the ground rail 157. One may choose the transistor configuration based on the specific circuit design.

FIG. 6 shows a serial multiplexer circuit 170 having an output stage 172 that includes a pull-up transistor 174. The serial multiplexer circuit has number designations adjacent its active elements. These number designations will be used in conjunction with the diagram shown in FIG. 7.

Figure 7:
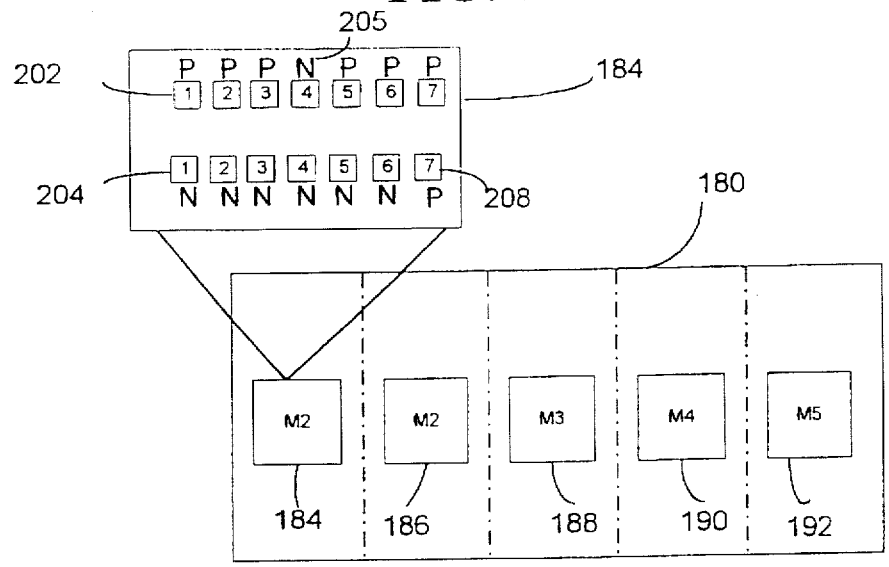
FIG. 7 is a diagram of a base cell with an illustrative transistor layout having numbers corresponding to the numbered elements of FIG. 6.

FIG. 7 shows a base cell 180 having five isolated (either physically or electrically) multiplexer circuits. The base cell 180 has two two-input multiplexer circuits 184, 186, a three-input multiplexer circuit 188, a four-input multiplexer circuit 190, and a five-input multiplexer circuit 192. This is yet another illustration of the mixing of different sizes of serial multiplexers that can be used in a base cell of the present invention. Each serial multiplexer is located in a separate section of the base cell wherein the sections are shown divided by dashed lines. As in FIG. 2, the sections (and serial multiplexers therein) are isolated from one another. An enlarged transistor configuration is shown for the two-input serial multiplexer circuit 184 with letter designations indicating whether the transistor is N- or P-channel, and number designations indicating the element implemented that corresponds to the numbers in FIG. 6. For example, the inverter 200 in FIG. 6 is labeled as a "1", and in FIG. 7, it is formed from a combination of opposed P- and N-channel transistors 202, 204.

The transistor configurations in circuit 184 are shown having an N-channel transistor 205 in a P-type diffusion row and a single P-channel transistor 208 in an N-type diffusion row. However, different configurations can be used based on the application. For example, any number of N-channel transistors may be in the P-type diffusion row, or any number of P-channel transistors may be in the N-type diffusion row. Metal runs should be used to bring the appropriate power levels to these transistors (e.g., 205 and 208), as already described in FIG. 5. Additionally, although the base cell 180 is shown having five serial multiplexers 184–192, the base cell may include any number of serial multiplexer circuits, with each multiplexer circuit being any desired size (including equal in size).

Figure 8:
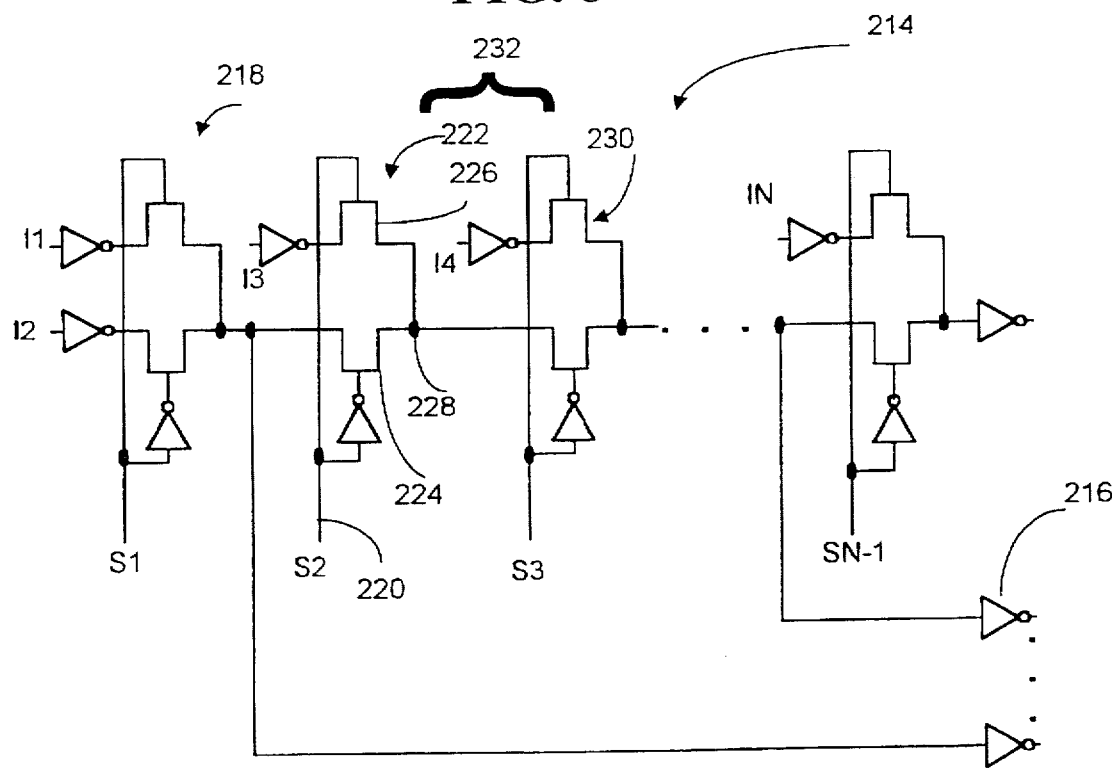
FIG. 8 shows an integral serial multiplexer circuit used in a base cell that is divisible into separate serial multiplexer circuits.

FIG. 8 shows a continuous integral serial multiplexer circuit 214 having N inputs and N–1 stages for use in a base cell 16. The circuit has tapped outputs 216 located at desirable locations. The serial multiplexer circuit 214 can be used to create multiple derivative serial multiplexer circuits by electrically isolating each derivative serial multiplexer circuits using the select lines. For example, in FIG. 8, a two-input serial multiplexer circuit 218 is shown as a first stage. A select line 220 to a second serial multiplexer circuit 222 may be tied to a logic high signal so that a transistor 224 is always in the "off" state, and a transistor 226 is always in the "on" state. Thus, an input I3 will pass to a common terminal 228. A third serial multiplexer stage 230 having an input I4 may be used in conjunction with the serial multiplexer 222 to create a two-input multiplexer circuit 232 that is electrically isolated from multiplexer circuit 218 by transistor 224. The two-input multiplexer circuit 232, which is a combination of serial multiplexers 222 and 230, includes inputs I4 and I3. Multiplexer circuit 218 and multiplexer circuit 232 are derivative serial multiplexer circuits that are divided from integral multiplexer circuit 214. In this way, virtually any number of serial multiplexer circuits can be implemented on a base cell.

The gate array architecture of the present invention provides several advantages over prior architectures. For example, having functional serial multiplexer circuits on a master wafer allows a designer to provide a vendor only a serial-multiplexer-to-serial-multiplexer interconnect netlist (components are already formed), rather than a netlist to interconnect transistors to form general multiplexer circuits and to provide serial-multiplexer-to-serial-multiplexer interconnections. This allows a vendor to use fewer metal masks to create the design-specific circuit, which reduces costs and allows for faster turnaround from delivery of a netlist to production of an ASIC.

In view of the many possible embodiments to which the principles of our invention may be applied, it should be recognized that the illustrated embodiment is only a preferred example of the invention and should not be taken as a limitation on the scope of the invention. Rather, the invention is defined by the following claims. We therefore claim as our invention all such embodiments that come within the scope of these claims.

We claim:

1. A gate array architecture for use in a master wafer comprising:
   a base cell having first and second sections isolated from each other;
   a first fully wired serial multiplexer circuit within the first section, the first serial multiplexer circuit having a first number of inputs;
   a second fully wired, serial multiplexer circuit within the second section, the second serial multiplexer circuit having a second number of inputs, the second number of inputs being greater than the first number of inputs;
   wherein the base cell is one of a plurality of base cells in the gate array; and
   wherein the first and second serial multiplexer circuits are electrically isolated from each other.

2. The gate array architecture of claim 1, wherein the first serial multiplexer circuit is formed from a plurality of transistors having predetermined connections therebetween.

3. The gate array architecture of claim 2 wherein the predetermined connections of transistors forming the first serial multiplexer is design-independent.

4. The gate array architecture of claim 3, wherein the first serial multiplexer circuit is formed from a row of P-channel transistors parallel to and adjacent to a row of N-channel transistors, the P- and N-channel transistors having varying sizes.

5. The gate array architecture of claim 1 wherein the first and second serial multiplexer circuits are physically isolated from each other.

6. The gate array architecture of claim 1 wherein the first serial multiplexer circuit is a two-input serial multiplexer circuit and the second serial multiplexer circuit is a three-input serial multiplexer circuit.

7. The gate array architecture of claim 1 further including a third section within the base cell, the third section including a third serial multiplexer circuit having a third number of inputs that is greater than the number of inputs from both the first and second serial multiplexer circuits.

8. The gate array architecture of claim 1 wherein the first and second serial multiplexer circuits comprise P- and N-channel transistors wherein the N-channel transistors vary in size and wherein the P-channel transistors vary in size.

9. The gate array architecture of claim 1 including power and ground rails with a row of N-channel transistors adjacent to the ground rail and a row of P-channel transistors adjacent to the power rail.

10. The gate array architecture of claim 9 further including an N-channel transistor positioned adjacent to the power rail.

11. The gate array architecture of claim 9 further including a P-channel transistor positioned adjacent to the ground rail.

12. The gate array architecture of claim 10 wherein the N-channel transistors are physically isolated from each other and the P-channel transistors are physically isolated from each other.

13. The gate array architecture of claim 9 wherein the row of P-channel transistors is formed from a continuous diffusion, and the row of N-channel transistors is formed from a continuous diffusion.

14. A gate array architecture for use in a master wafer comprising:
   a base cell having first and second sections isolated from each other;
   a first fully wired serial multiplexer circuit within the first section, the first serial multiplexer circuit having a first number of inputs;
   a second fully wired, serial multiplexer circuit within the second section, the second serial multiplexer circuit having a second number of inputs, the second number of inputs being greater than the first number of inputs;
   wherein the base cell is one of a plurality of base cells in the gate array; and
   including power and ground rails with a row of N-channel transistors adjacent to the ground rail and a row of P-channel transistors adjacent the power rail, the N-channel and P-channel transistors used to form the first and second serial multiplexer circuits.

15. The gate array architecture of claim 14 wherein the P-channel and N-channel transistors are varying sizes.

16. A gate array architecture for use in a master wafer comprising:
   a base cell having first and second sections isolated from each other;
   a first fully wired serial multiplexer circuit within the first section, the first serial multiplexer circuit having a first number of inputs;
   a second fully wired, serial multiplexer circuit within the second section, the second serial multiplexer circuit having a second number of inputs, the second number of inputs being greater than the first number of inputs;
   wherein the base cell is one of a plurality of base cells in the gate array; and
   wherein the first serial multiplexer circuit is a two-input serial multiplexer circuit and the second serial multiplexer circuit is a three-input serial multiplexer circuit.

17. The gate array architecture of claim 16 wherein the first and second serial multiplexer circuits comprise P- and N-channel transistors wherein the N-channel transistors vary in size and wherein the P-channel transistors vary in size.

18. The gate array architecture of claim 16 including power and ground rails with a row of N-channel transistors adjacent to the ground rail and a row of P-channel transistors adjacent to the power rail.

19. The gate array architecture of claim 18 further including an N-channel transistor positioned adjacent to the power rail.

20. The gate array architecture of claim 18 further including a P-channel transistor positioned adjacent to the ground rail.

21. The gate array architecture of claim 18 wherein the row of P-channel transistors is formed from a continuous diffusion, and the row of N-channel transistors is formed from a continuous diffusion.

* * * * *

UNITED STATES PATENT AND TRADEMARK OFFICE
CERTIFICATE OF CORRECTION

PATENT NO. : 5,796,128

DATED : August 18, 1998

INVENTOR(S) : Tran et al.

It is certified that error appears in the above-identified patent and that said Letters Patent is hereby corrected as shown below:

| Col./Line | Error Reads | Should Read |
|---|---|---|
| 8/20 | claim 10 | claim 9 |

Signed and Sealed this

Fourth Day of January, 2000

Attest:

Attesting Officer

*Acting Commissioner of Patents and Trademarks*